(12) United States Patent
Landgraf et al.

(10) Patent No.: US 6,882,007 B2
(45) Date of Patent: Apr. 19, 2005

(54) SRAM MEMORY CELL, MEMORY CELL ARRANGEMENT AND METHOD FOR FABRICATING A MEMORY CELL ARRANGEMENT

(75) Inventors: Erhard Landgraf, München (DE); Richard Johannes Luyken, München (DE); Christian Pacha, München (DE); Thomas Schulz, München (DE)

(73) Assignee: Infineon Technologies AG (DE)

( * ) Notice: Subject to any disclaimer, the term of this patent is extended or adjusted under 35 U.S.C. 154(b) by 64 days.

(21) Appl. No.: 10/387,256

(22) Filed: Mar. 11, 2003

(65) Prior Publication Data

US 2004/0099902 A1 May 27, 2004

(30) Foreign Application Priority Data

Mar. 14, 2002 (DE) .......................... 102 11 335

(51) Int. Cl.[7] ............................... H01L 29/76
(52) U.S. Cl. ....................... 257/329; 438/212
(58) Field of Search ................. 257/328, 329; 438/329

(56) References Cited

U.S. PATENT DOCUMENTS 5,364,810 A  11/1994 Kosa et al.
2002/0006698 A1  1/2002 Noble
2002/0027802 A1 * 3/2002 Noble ................. 365/154

OTHER PUBLICATIONS

Subbanna, S., et al., A High–Density 6.9 sq. $\mu$m Embedded SRAM Cell in a High–Performance 0.25 $\mu$m– Generation CMOS Logic Technology, IEDM 96, pp. 275–278 (1996).
Lage, C., et al., Advanced SRAM Technology—The Race Between 4T and 6T Cells, IEDM 96, pp. 271–274 (1996).

* cited by examiner

*Primary Examiner*—Douglas Wille
(74) *Attorney, Agent, or Firm*—Altera Law Group, LLC; Jeffrey R. Stone

(57) ABSTRACT

The invention relates to an SRAM memory cell, a memory cell arrangement and a method for fabricating a memory cell arrangement. The SRAM memory cell has six vertical transistors, of which four are connected up as flip-flip transistors and two are connected up as switching transistors, four of the vertical transistors being arranged at corners of the rectangular base area.

28 Claims, 11 Drawing Sheets

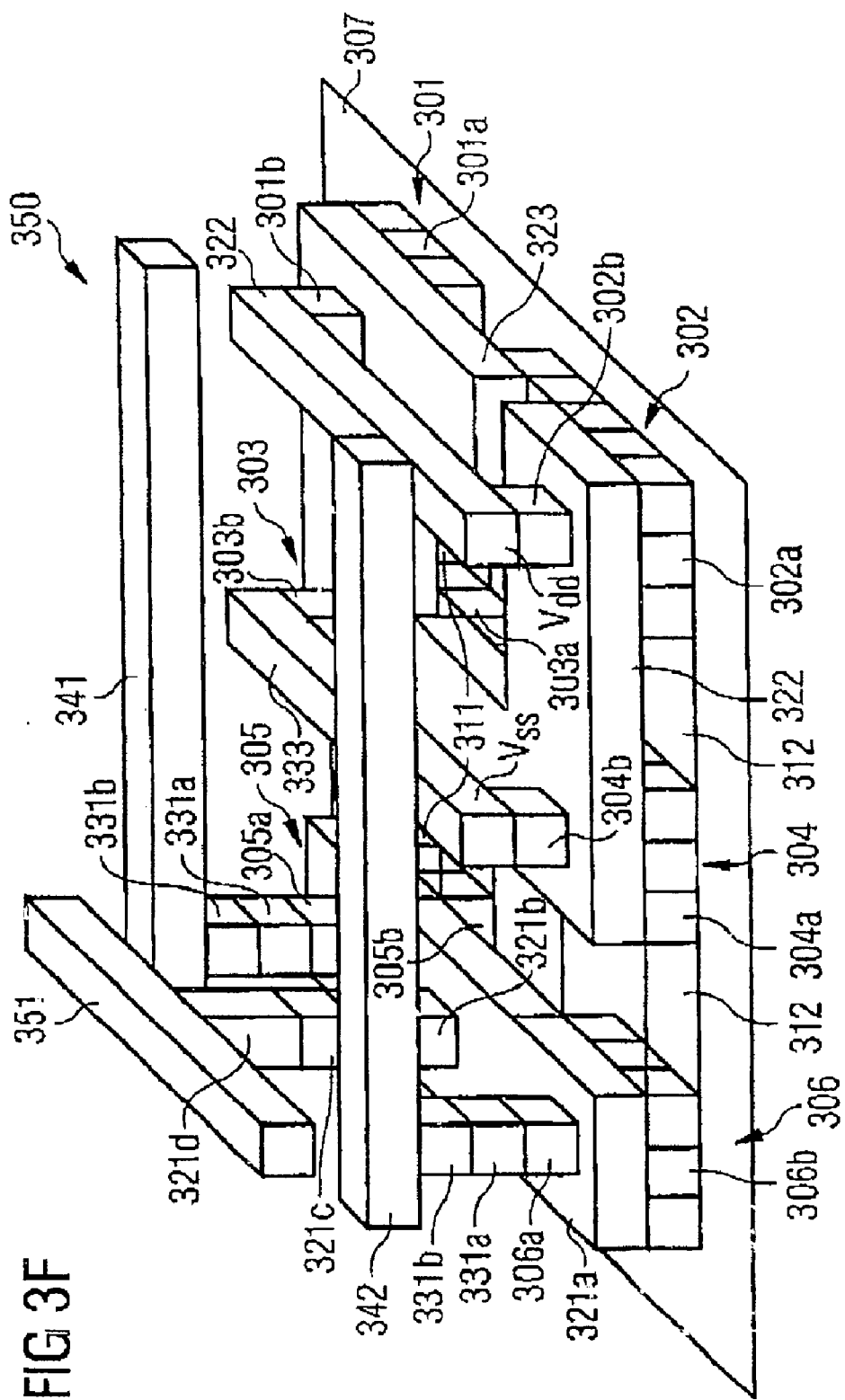

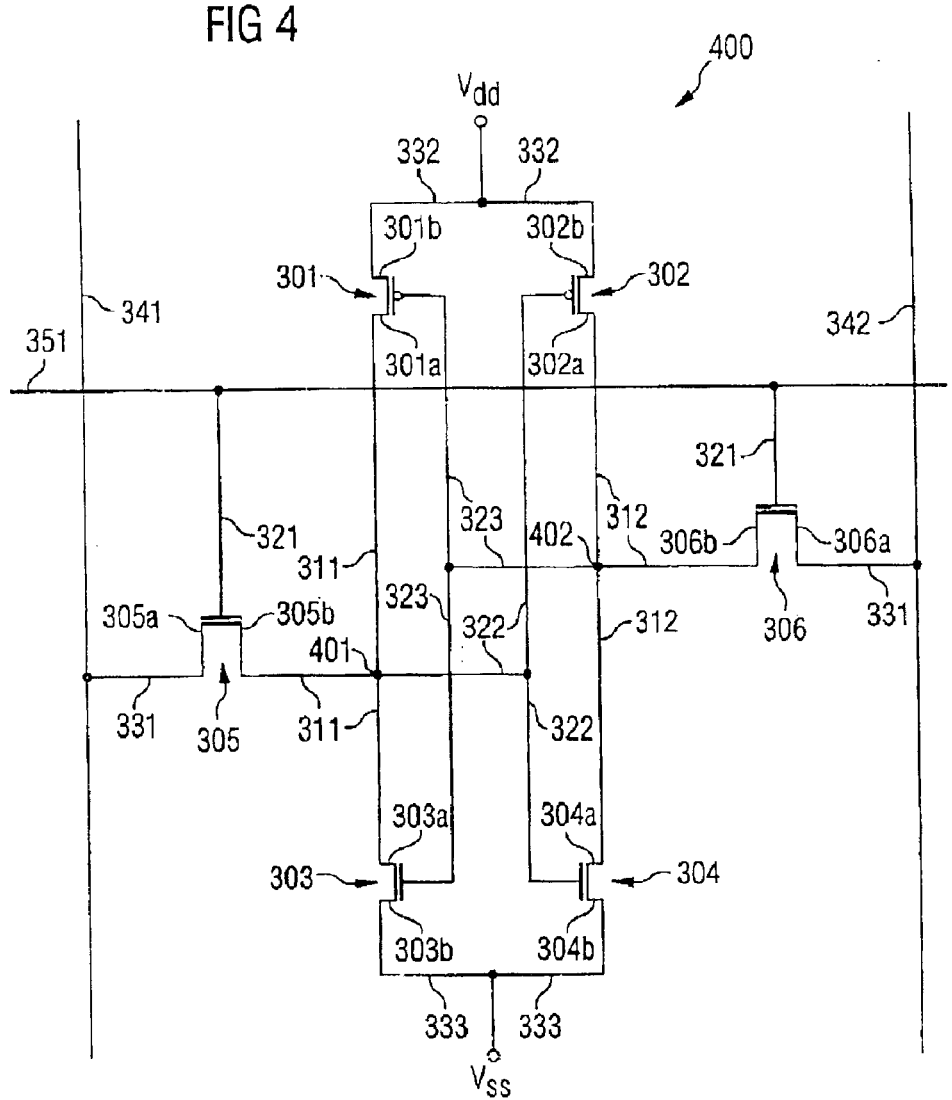

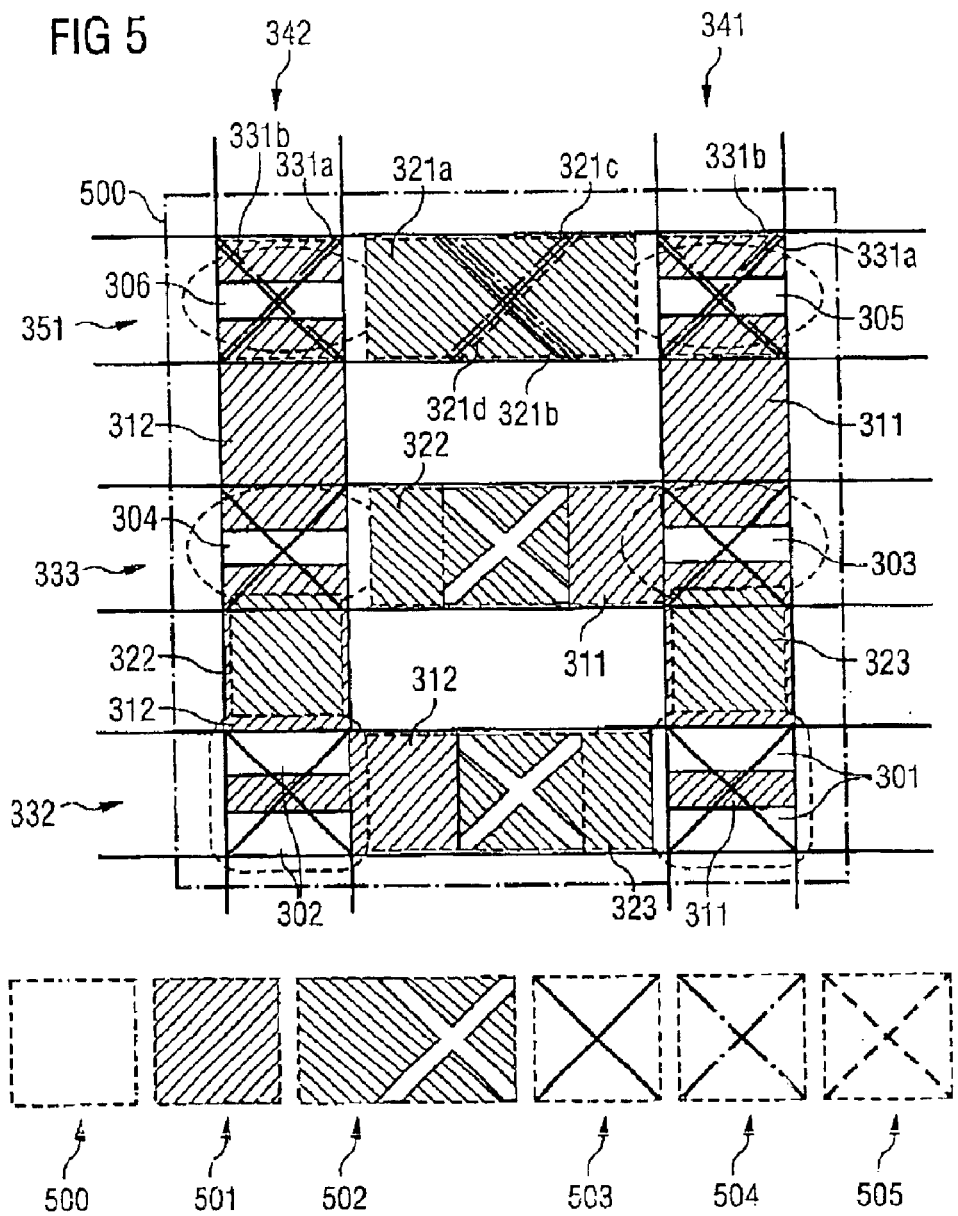

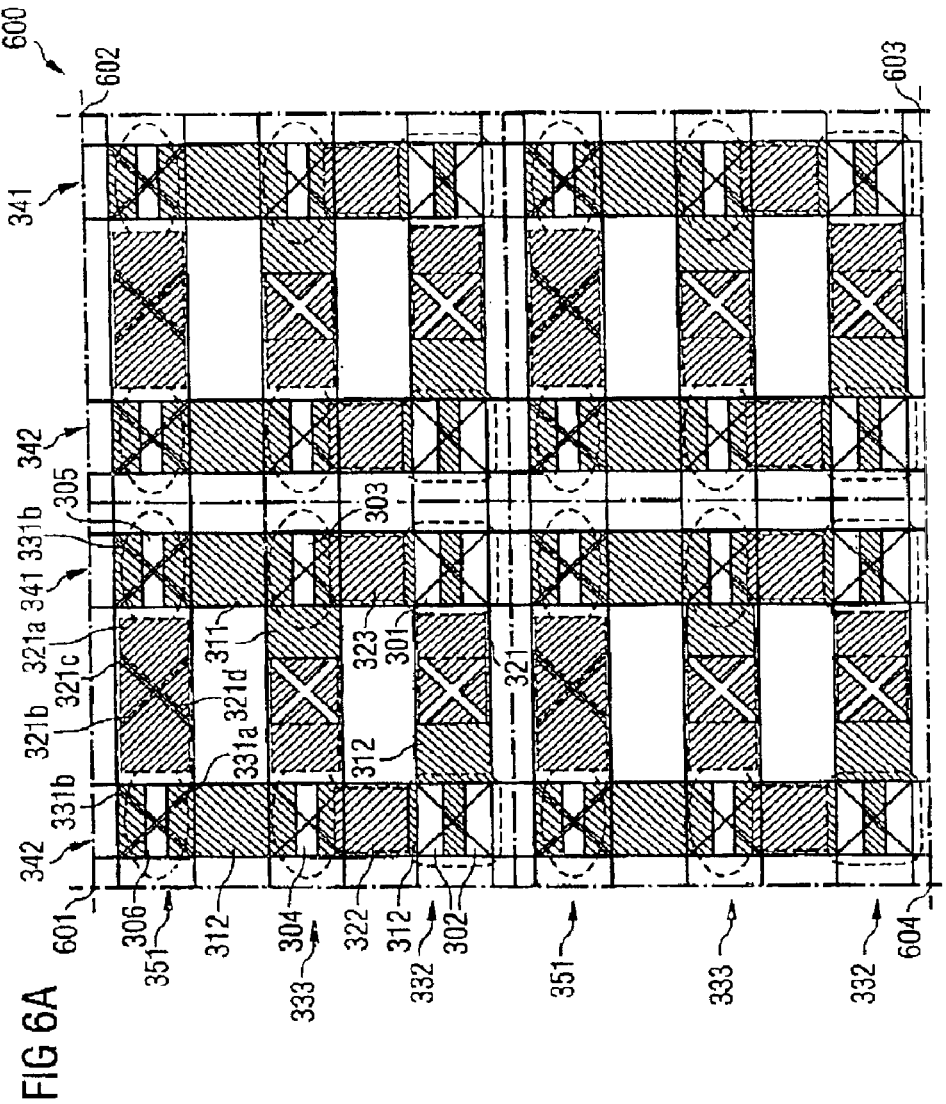

SRAM MEMORY CELL, MEMORY CELL ARRANGEMENT AND METHOD FOR FABRICATING A MEMORY CELL ARRANGEMENT

BACKGROUND OF THE INVENTION

1. Field of the Invention

The invention relates to an SRAM memory cell, a memory cell arrangement and a method for fabricating a memory cell arrangement.

2. Description of the Related Prior Art

Conventional silicon microelectronics usually uses horizontally formed MOSFETs ("Metal Oxide Semiconductor Field Effect Transistors"), in which the surface of a substrate on or in which the MOSFET is formed is oriented parallel to a gate oxide layer arranged thereon and parallel to a gate electrode arranged on the gate oxide layer. In order to achieve further miniaturization in silicon microtechnology, efforts are being undertaken to form a vertically layered transistor, i.e. a transistor in which the gate oxide layer is arranged essentially perpendicular to the surface of the substrate on or in which the vertical transistor is formed.

BRIEF SUMMARY OF THE INVENTION

A method for fabricating vertical transistors is disclosed in [1], for example, and is described below with reference to FIG. 1A and FIG. 1B.

FIG. 1A shows a vertical transistor 100. An n-doped source region 102 is applied on an n-doped substrate 101. A p-doped intermediate region 103 is applied on the n-doped source region 102. An n-doped drain region 104 is applied on the p-doped intermediate region 103. In other words, in accordance with the conception shown in FIG. 1A, both the source region and the drain region are realized as layers formed parallel to the substrate surface. As shown in FIG. 1A, a gate oxide layer 105 is applied orthogonally with respect to the surface of the n-doped substrate 101, which gate oxide layer extends in the vertical direction along the n-doped source region 102, the p-doped intermediate region 103 and the n-doped drain region 104. A gate electrode 106 is deposited laterally on the gate oxide layer 105.

Furthermore, FIG. 1B shows an enlarged section 110, also identified in FIG. 1A. This section illustrates that the n-doped source region 102, the p-doped intermediate region 103 and the n-doped drain region 104 are formed as layers that are parallel to one another and to the surface of the n-doped substrate 101, whereas the gate oxide layer 105 runs in the vertical direction with respect to the layers 101 to 104.

The functionality of the vertical transistor 100 is based on the fact that, as in conventional MOSFETs too, an electrically conductive channel is produced between the source region 102 and the drain region 104 by the gate electrode 106 being brought to a suitable electrical potential. This electrically conductive channel is depicted diagrammatically as a broken line 111 in FIG. 1A and FIG. 1B. If a suitable electrical voltage is applied to the gate electrode 106, then a conductive channel 111 is thereby produced, thus enabling a current flow between the n-doped source region 102 and the n-doped drain region 104. The vertical transistor 100 therefore fulfills the functionality of a MOSFET.

A vertical transistor has the advantage over planar technology that the vertical transistor has a smaller area requirement in the plane of the substrate. In other words, with vertical transistors it is possible to achieve a higher integration density of transistors per substrate surface than with horizontal transistors. Using transistors of reduced dimension, switching elements with shortened switching times can be achieved since the length of the conductive channel can also be shortened.

One important area of application of MOSFETs is so-called SRAM memories ("static random access memory"). These are to be understood as a static semiconductor memory whose memory content, in contrast to a dynamic RAM ("dynamic random access memory"), does not have to be continually refreshed. Only when a supply voltage is switched off is the information content stored in a static RAM lost. On account of their high speed (write and read times), static RAMs are used in cache memories for example.

Two important concepts of SRAM memory cells are known: in accordance with a first concept, four MOSFETs and two nonreactive resistors are connected up to one another in such a way that, using an upper reference potential $V_{dd}$ and a lower reference potential $V_{ss}$, the information to be stored and the complementary information with respect thereto are stored at two nodes of the SRAM memory cell. In accordance with an alternative concept, this aim is achieved by means of six transistors which are connected up between an upper reference potential $V_{dd}$ and a lower reference potential $V_{ss}$ in such a way that, as a result, one of two storage nodes can be occupied by the information to be stored, whereas the complementary information content with respect thereto is stored at the other storage node.

Many efforts are being undertaken to reduce the space requirement of an SRAM memory cell on an SRAM memory cell arrangement. An overview of the technological status is given by [2], [3], for example. These documents reveal that an SRAM memory cell having a space requirement of 64 $F^2$ and 85 $F^2$, respectively, is known. In this case, F is the smallest possible feature size that can be achieved with an available technology.

By way of example, in a technology in which structures having a size of 100 nm can be formed, an area requirement of 1 $F^2$ corresponds to a base area of 100 mm×100 nm.

However, on account of the increasing requirements made of cost-effective mass memories having a high storage capacity, there is a need to further reduce the space requirement of an SRAM memory cell on or in a surface region of a substrate.

FIG. 2 diagrammatically shows a memory cell arrangement 200 disclosed in [4].

An SRAM memory cell 201 of the memory cell arrangement 200 is an arrangement of interconnected vertical transistors on the surface of a substrate, a reduction of the space requirement of an SRAM memory cell on the surface of a semiconductor substrate being achieved in comparison with the concepts from [2], [3].

The memory cell arrangement 200 shown in FIG. 2 has a multiplicity of vertical transistors 203. The memory cell arrangement 200 contains a plurality of SRAM memory cells 201, only one of which is explicitly shown in FIG. 2. The SRAM memory cell 201 is formed on an octagonal base area 202. It should be noted that the memory cell arrangement 200 from FIG. 2 is only shown diagrammatically, and so not all the components of a memory cell arrangement are shown in FIG. 2 (for example bit lines and word lines are missing). Furthermore, the interconnection of the vertical transistors is not illustrated in FIG. 2.

The SRAM memory cell 201 on the octagonal base area 202 as shown in FIG. 2 has the disadvantage that the existing surface of the silicon substrate is not utilized optimally in specific cases. Thus, in particular, problems may arise with an SRAM memory cell 201 on an octagonal base area 202 if such an SRAM memory cell 201 or a memory cell arrangement 200 is to be coupled to integrated components of a logic circuit.

[5] discloses a six-transistor SRAM memory cell with two planar pass transistors, two vertical latch transistors and two vertical load transistors.

[6] discloses an SRAM memory cell with a flip-flop having an inverter pair with four vertical transistors. Furthermore, the SRAM memory cell contains two vertical access transistors. The six vertical transistors are arranged in such a way that three of the transistors are arranged along a first course direction and the three remaining transistors are arranged along a second course direction, which is parallel to the first course direction but is arranged offset with respect to the first course direction.

[7] discloses a memory cell comprising a field-effect transistor and a bipolar transistor.

The invention is based on the problem of providing an SRAM memory cell in which the available substrate surface is utilized more efficiently and in which a coupling to further circuit elements or to further SRAM memory cells can be realized with an increased packing density.

The problem is solved by means of an SRAM memory cell, a memory cell arrangement and a method for fabricating a memory cell arrangement having the features in accordance with the independent patent claims.

Preferred developments of the invention emerge from the dependent claims.

The invention provides an SRAM memory cell having six vertical transistors, of which four are connected up as flip-flop transistors and two are connected up as switching transistors, four of the vertical transistors being arranged at corners of the rectangular base area.

A rectangular base area of an SRAM memory cell enables the silicon surface to be utilized optimally.

Furthermore, the invention provides a memory cell arrangement having a plurality of SRAM memory cells having the features mentioned above.

Therefore, in the memory cell arrangement according to the invention, a plurality of SRAM memory cells each having a rectangular base area can be arranged in two dimensions such that the loss of area between adjacent SRAM memory cells is very small. Therefore, it is possible to achieve a space-saving arrangement of SRAM memory cells with a high packing density.

Furthermore, the invention provides a method for fabricating a memory cell arrangement, in which an SRAM memory cell is formed by six vertical transistors, of which four are connected up as flip-flop transistors and two are connected up as switching transistors, being formed on a rectangular base area, four of the vertical transistors being arranged at corners of the rectangular base area.

With the method according to the invention, an SRAM memory cell having the features mentioned above is obtained with a low outlay.

Refinements of the SRAM memory cell are described below.

In the case of the SRAM memory cell according to the invention, the rectangular base area may be divided into a first and a second rectangular partial region, the flip-flop transistors being arranged at the corners (or in the corner regions) of the first rectangular partial region, and the switching transistors being arranged at the two corners (or in the two corner regions) of the second partial region which are also corners of the rectangular surface region.

The described arrangement of the four flip-flop transistors and the two switching transistors of an SRAM memory cell in accordance with the six-transistor principle of an SRAM memory cell enables a particularly space-saving arrangement of bit and word lines (see description of the layout below).

The rectangular base area of the SRAM memory cell may be square, in particular.

In accordance with a preferred exemplary embodiment, the side length of the square base area of the SRAM memory cell is six times the smallest possible feature size F that can be achieved.

In other words, the invention provides an SRAM memory cell having a space requirement of 36 $F^2$ on the surface of a substrate, which can be obtained if the area requirement of a vertical transistor is 4 $F^2$. In the case of transistors having an area requirement smaller than 4 $F^2$, it is accordingly possible to achieve a further reduced base area of the SRAM memory cell. The layout according to the invention with six vertical transistors arranged at a distance from one another and with the associated contact connections (see description below) constitutes a particularly favorable layout which leads to a space requirement per SRAM memory cell of 36 $F^2$. A further improvement is possible if integrated circuit components (transistors or contact holes) are obviated or if the minimum area requirement thereof is reduced to less than 4 $F^2$.

Preferably, at least some of the transistors of the SRAM memory cell are field-effect transistors or bipolar transistors.

Field-effect transistors, in particular MOSFETs, are often used as transistors for an SRAM memory cell. According to the invention, bipolar transistors, which can likewise be formed with a tenable outlay as integrated circuit elements, can be used as an alternative or supplementarily. Furthermore, both the field-effect transistors and the bipolar transistors of the SRAM memory cell according to the invention may be formed as transistors of the p conduction type or of the n conduction type. Field-effect transistors and bipolar transistors are inexpensive, widespread integrated circuit elements which can be formed with a low outlay and which can be adapted flexibly to the requirements of the individual case for the configuration of the SRAM memory cell according to the invention.

The memory cell arrangement according to the invention, which has a plurality of SRAM memory cells according to the invention, is described in more detail below. Refinements of the SRAM memory cell also apply to the memory cell arrangement having SRAM memory cells.

The memory cell arrangement according to the invention preferably has an electrically conductive word line which is electrically connected to the gate regions of the switching transistors. The memory cell arrangement preferably has a first and a second electrically conductive bit line, the first of which is coupled to the first source/drain region of a first switching transistor and the second of which is coupled to the first source/drain region of a second switching transistor.

In accordance with an advantageous refinement, in the memory cell arrangement according to the invention, the second source/drain region or the first switching transistor is electrically connected to the first source/drain regions of a first and of a third flip-flop transistor and also to the gate regions of a second and of a fourth flip-flop transistor.

The second source/drain region of the second switching transistor may be electrically connected to the first source/ drain regions of the second and of the fourth flip-flop transistor and also to the gate regions of the first and of the third flip-flop transistor.

Furthermore, the memory cell arrangement may have a first reference potential, which is applied to the second source/drain regions of the first and of the second flip-flop transistor. Furthermore, the memory cell arrangement may have a second reference potential, which is applied to the second source/drain regions of the third and of the fourth flip-flop transistor.

In particular, the first reference potential may be defined by means of a supply voltage source. The second reference potential may be a ground potential.

In an SRAM memory cell of the memory cell arrangement, the first and the second flip-flop transistor may be arranged at corners of the rectangular base area.

The first and the second bit line preferably run essentially perpendicular to the word line, and the first and the second bit line preferably run essentially parallel to one another.

The rectangular base area of an SRAM memory cell of the memory cell arrangement according to the invention may be an electrically insulating region.

In the memory cell arrangement, a first coupling means for coupling the second source/drain region of the first switching transistor to the first source/drain regions of the first and of the third flip-flop transistor, and a second coupling means for coupling the second source/drain region of the second switching transistor to the first source/drain regions of the second and of the fourth flip-flop transistor may be formed in a first plane above the rectangular base area.

A first part of a third coupling means for electrically coupling the gate regions of the switching transistors to the word line, a fourth coupling means for coupling the second source/drain region of the first switching transistor to the gate regions of the second and fourth flip-flop transistors, and a fifth coupling means for coupling the second source/drain region of the second switching transistor to the gate regions of the first and third flip-flop transistors may be formed in a second plane above the first plane.

Furthermore, a second part of the third coupling means for electrically coupling the gate regions of the switching transistors to the word line, a first part of a sixth coupling means for electrically coupling the first source/drain regions of the switching transistors to the bit lines, a seventh coupling means for coupling the second source/drain regions of the first and of the second flip-flop transistor to the first reference potential, and an eighth coupling means for coupling the second source/drain regions of the third and of the fourth flip-flop transistor to the second reference potential may be formed at a third plane above the second plane.

In the memory cell arrangement according to the invention, furthermore, a third part of the third coupling means for electrically coupling the gate regions of the switching transistors to the word line, a second part of the sixth coupling means for electrically coupling the first source/drain regions of the switching transistors to the bit lines, and the first bit line, coupled to the first source/drain region of the first switching transistor, and the second bit line, coupled to the first source/drain region of the second switching transistor, may be formed in a fourth plane above the third plane.

Moreover, a fourth part of the third coupling means for electrically coupling the gate regions of the switching transistor to the word line and the word line, coupled to the gate regions of the first and of the second switching transistor, may be formed in a fifth plane above the fourth plane.

The described refinements of the memory cell arrangement according to the invention enable a particularly advantageous layout in which both the SRAM memory cells and the coupling means for coupling the transistors of the SRAM memory cell are connected up in a space-saving manner. In particular, those components which are formed jointly for a plurality of SRAM memory cells, for example the word and bit lines, are configured particularly efficiently. This enables a high packing density of SRAM memory cells of a memory cell arrangement and a functionally conforming electrical driveability of the SRAM memory cells and the components thereof in a memory cell arrangement.

The method according to the invention for fabricating the memory cell arrangement according to the invention is described in more detail below. Refinements of the memory cell arrangement also apply to the method for fabricating the memory cell arrangement.

In accordance with a preferred development of the method according to the invention, on the rectangular base area of the SRAM memory cell, said rectangular base area being divided into a first and into a second rectangular partial region, the flip-flop transistors are formed at the corners (or in the corner regions) of the first rectangular partial region, and the switching transistors are formed at the two corners (or in the corner regions) of the second partial region which are also corners (or corner regions) of the rectangular base area.

Furthermore, a first coupling means for coupling the second source/drain region of a first switching transistor to the first source/drain regions of a first and of a third flip-flop transistor, and a second coupling means for coupling the second source/drain region of a second switching transistor to the first source/drain regions of a second and of a fourth flip-flop transistor may be formed in a first plane above the rectangular base area.

Furthermore, a first part of a third coupling means for electrically coupling the gate regions of the switching transistors to one another and to a word line, a fourth coupling means for coupling the second source/drain region of the first switching transistor to the gate regions of the second and fourth flip-flop transistors, and a fifth coupling means for coupling the second source/drain region of the second switching transistor to the gate regions of the first and third flip-flop transistors may be formed in a second plane above the first plane.

Moreover, a second part of the third coupling means for electrically coupling the gate regions of the switching transistors to a word line, a first part of a sixth coupling means for electrically coupling the first source/drain regions of the switching transistors to the bit lines, a seventh coupling means for coupling the second source/drain regions of the first and of the second flip-flop transistor to a first reference potential, and an eighth coupling means for coupling the second source/drain regions of the third and of the fourth flip-flop transistor to a second reference potential may be formed in a third plane above the second plane.

Furthermore, in the method, a third part of the third coupling means for electrically coupling the gate regions of the switching transistors to a word line, a second part of the sixth coupling means for electrically coupling the first source/drain regions of the switching transistors to bit lines, and a first bit line, coupled to the first source/drain region of the first switching transistor, and a second bit line, coupled to the first source/drain region of the second switching transistor, may be formed in a fourth plane above the third plane.

In accordance with the method, a fourth part of the third coupling means for electrically coupling the gate regions of the switching transistors to a word line and a word line, coupled to the gate regions of the first and of the second switching transistor, may be formed in a fifth plane above the fourth plane.

The described partial steps of the method according to the invention for fabricating a memory cell arrangement can be realized by widespread, technologically mature methods which can be carried out with a tenable outlay. By means of a skillfully chosen order of method steps, it is possible to fabricate a memory cell arrangement which has a high packing density of SRAM memory cells, which can be coupled to further circuit elements (for example a logic circuit) with a high degree of area efficiency, and in which driving via word and bit lines is realized efficiently.

In particular, partial steps of the fabrication method necessitate the deposition and patterning of layers. This can be realized using conventional semiconductor-technological deposition methods (for example chemical vapor deposition, molecular beam epitaxy, etc.), known lithography methods (for example optical lithography, electron beam lithography) and also known etching methods (for example wet or dry etching).

Clearly, an alternative wiring of the components of an SRAM memory cell arrangement to that in [4] is chosen according to the invention. In particular, the arrangement of the lines (word and bit lines) and of the various metal planes is simplified according to the invention. Moreover, an improved geometrical arrangement of the transistors of an SRAM memory cell is performed. In other words, the structure of an SRAM memory cell and of the associated layout of a memory cell arrangement is improved by providing a rectangular, in particular square, base area having an area requirement of 36 $F^2$. The rectangular base area enables a further increase in the packing density in so-called hybrid circuits, i.e. a circuit arrangement with an SRAM memory cell and an additional circuit component, for example a logic circuit. It should be emphasized that the vertical transistors of the SRAM memory cell according to the invention can be formed as described above with reference to FIG. 1A, FIG. 1B, or as described in [4]. However, it is also possible to use any other concept for the realization of vertical transistors in order to form the vertical transistors of the SRAM memory cell according to the invention. The surface area requirement of a vertical transistor, preferably of a MOSFET, is preferably 4 $F^2$ or less.

Exemplary embodiments of the invention are illustrated in the figures and are explained in more detail below.

BRIEF DESCRIPTION OF THE DRAWINGS

In the figures:

FIG. 3F shows a perspective view of a memory cell arrangement in accordance with the first exemplary embodiment of the invention, FIG. 4 shows an equivalent circuit of the memory cell arrangement in accordance with the first exemplary embodiment of the invention as shown in FIG. 3F, FIG. 5 shows a layout view in plan view of a memory cell arrangement in accordance with the first exemplary embodiment of the invention, FIG. 6A shows a layout view in plan view of a memory cell arrangement in accordance with a second exemplary embodiment of the invention.

FIG. 3A shows a diagrammatic perspective view of the base area of an SRAM memory cell of a memory cell arrangement in accordance with a first exemplary embodiment of the invention.

Figure 1A:
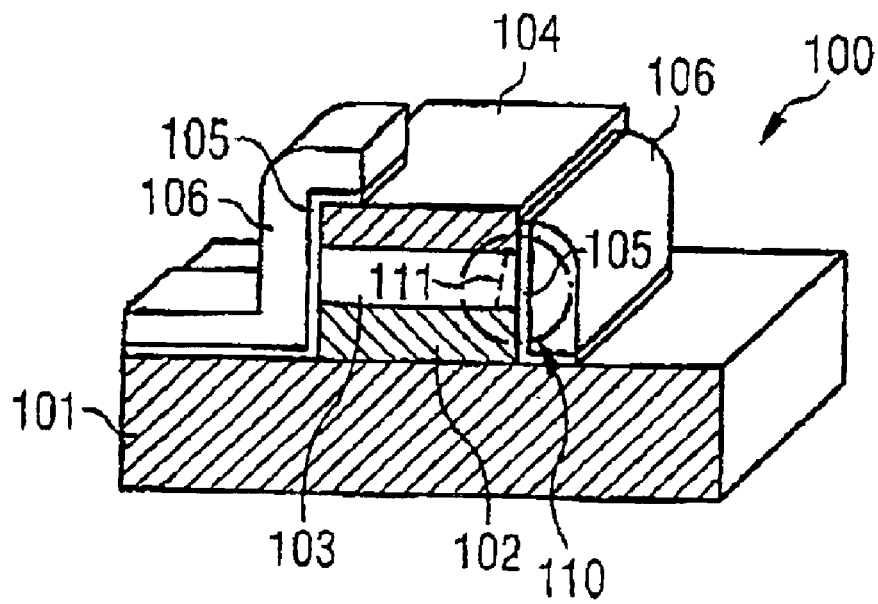
FIG. 1A shows a vertical transistor in accordance with the prior art.
Figure 1B:
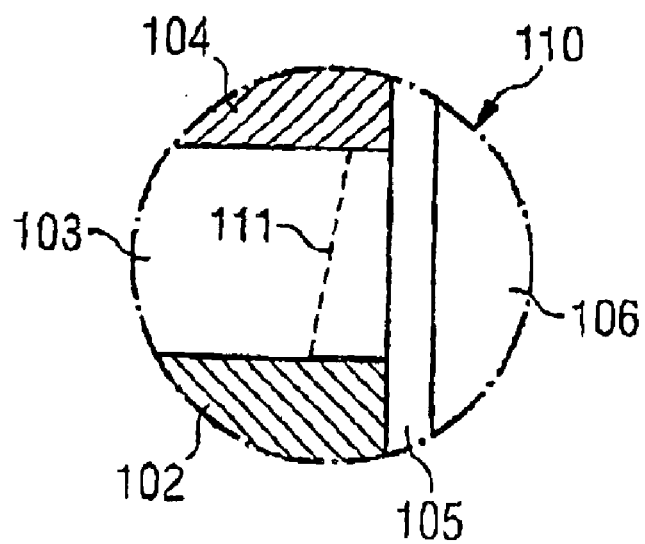
FIG. 1B shows an enlarged section of the vertical transistor in accordance with the prior art as shown in FIG. 1A.

The diagrammatic view 300 shows an SRAM memory cell having six vertical transistors, of which four are connected up as flip-flop transistors (first flip-flop transistor 301, second flip-flop transistor 302, third flip-flop transistor 303, fourth flip-flop transistor 304) and two are connected up as switching transistors (first switching transistor 305, second switching transistor 306), four of the vertical transistors, namely the first flip-flop transistor 301, the second flip-flop transistor 302, the first switching transistor 305 and the second switching transistor 306, being arranged at corners or in corner regions of the rectangular base area 307.

Figure 2:
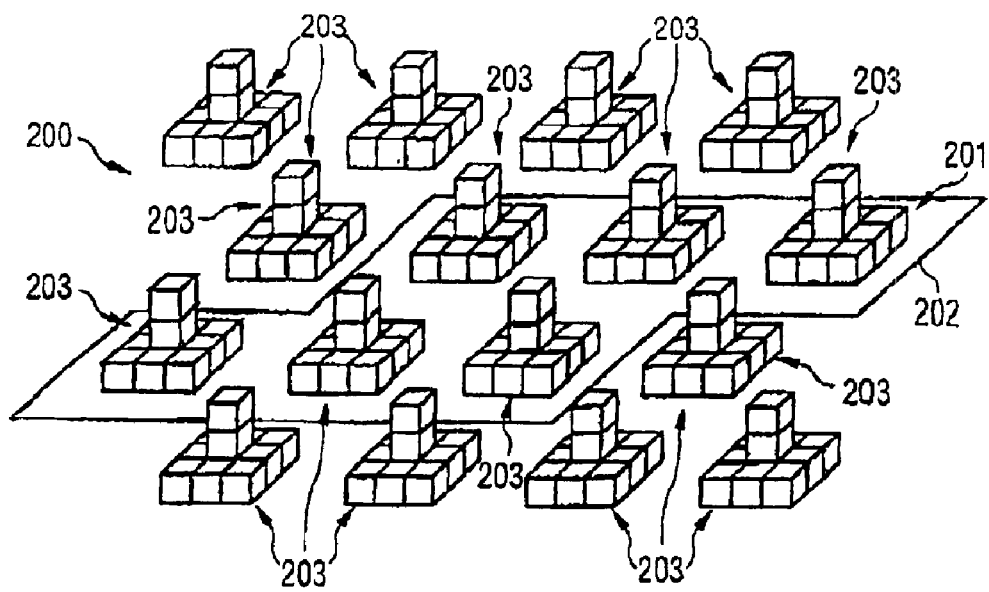
FIG. 2 shows a diagrammatic view of the octagonal base area of an SRAM memory cell in accordance with the prior art.
Figure 3A:
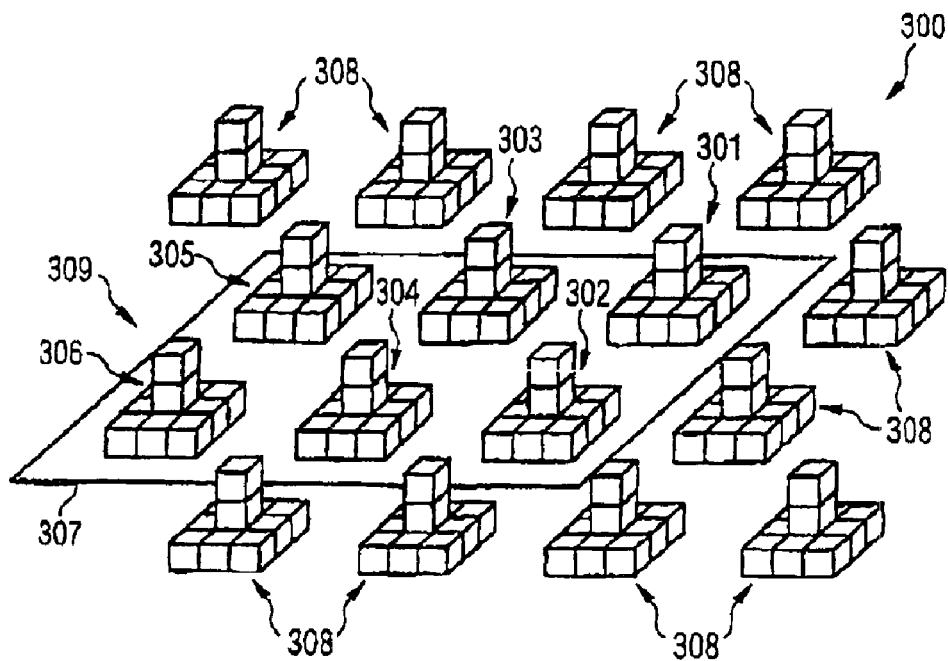
FIG. 3A shows a diagrammatic perspective view of the rectangular base area of an SRAM memory cell of a memory cell arrangement in accordance with a first exemplary embodiment of the invention.

It should be pointed out that the diagrammatic view 300 from FIG. 3A does not show the interconnection of the flip-flop transistors 301 to 304 and of the switching transistors 305, 306 such that an SRAM memory cell is thereby formed. Said interconnection is described in detail below with reference to FIG. 3B to FIG. 3F. A difference between the SRAM memory cell 201 which is known from the prior art and is shown in FIG. 2 and the SRAM memory cell 300 according to the invention is that, in accordance with the prior art, the six vertical transistors are arranged on an octagonal base area, whereas, according to the invention, the six vertical transistors 301 to 306 are arranged on the rectangular base area 307. As described in detail further below with reference to the description of the interconnection of the transistors 301 to 306, the layout according to the invention results in the advantage of a space-saving arrangement of the SRAM memory cell and the possibility of interconnecting such a memory cell with further circuit components, for example logic circuits, in a space-saving manner. It should be pointed out that, apart from the altered base area geometry, the SRAM memory cell 201 shown in FIG. 2 differs in further aspects from the SRAM memory cell according to the invention, in particular as far as the interconnection of the transistors 301 to 306 with one another is concerned.

It should be noted that FIG. 3A furthermore shows further vertical transistors 308 associated with further SRAM memory cells of the memory cell arrangement. It can clearly be understood from the arrangement of said further vertical transistors 308 how memory cells adjacent to the SRAM memory cell shown are arranged or formed. For the purposes of a simplified description, said further vertical transistors 308 are not described in any further detail below.

A preferred exemplary embodiment of the method according to the invention for fabricating a memory cell arrangement is described below with reference to FIG. 3B to FIG. 3F.

Figure 3B:
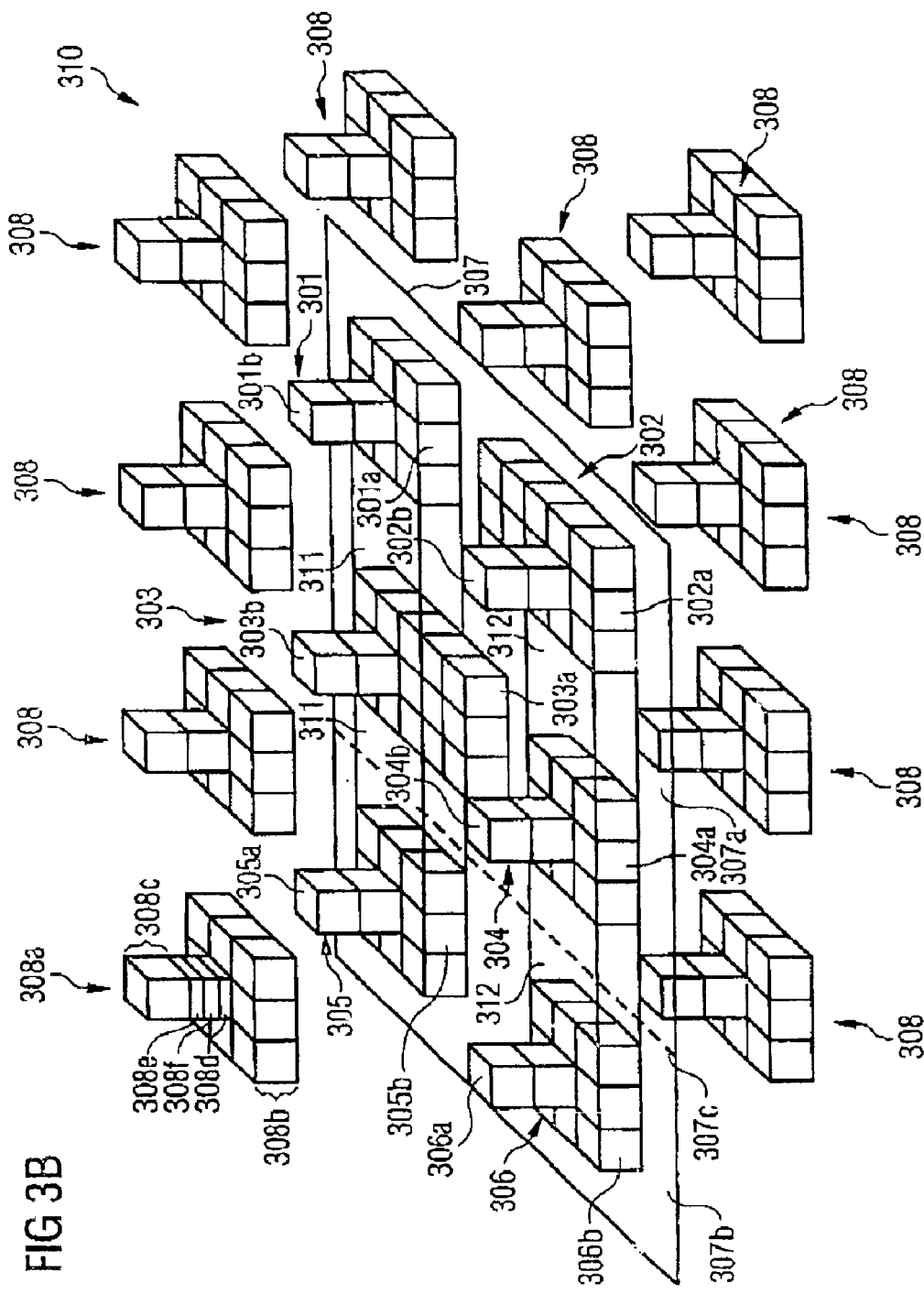
FIG. 3B shows a perspective view of a layer arrangement at a first point in time during the method for fabricating a memory cell arrangement in accordance wish the first exemplary embodiment of the invention.

In order to attain the layer arrangement 310 shown in FIG. 3B, on the rectangular base area 307 of the SRAM memory cell, which rectangular base area is divided into a first rectangular partial region 307a and into a second rectangular partial region 307b, the flip-flop transistors 301 to 304 are formed in the four corner regions of the first rectangular partial region 307a, and the switching transistors 305, 306 are formed in the two corner regions of the second partial region 307a, which corner regions are also corner regions of the rectangular base area 307.

The first rectangular partial region 307a and the second rectangular partial region 307b are separated from one another by means of the separating line 307c shown in FIG. 3B.

The transistors are formed for example as described in [1] or as described in [4]. The illustration of the vertical transistors 301 to 306, 308, 308a in FIG. 3B is diagrammatic. The way in which the essential components of the vertical transistors in the diagrammatic view in FIG. 3B are formed is described below with reference to the vertical transistor 308a shown in FIG. 3B.

The vertical transistor 308a has a lower source/drain terminal 308b and an upper source/drain terminal 308c, which are coupled to one another by means of a layer sequence 308d, 308e, 308f. As shown in FIG. 3B, the lower source/drain terminal 308b is coupled to the lower source/drain region 308d, the lower source/drain region 308d is coupled to an intermediate region 308f, and the intermediate region 308f is coupled to an upper source/drain region 308e coupled to the upper source/drain terminal 308c. In this case, the functionality of the lower source/drain terminal 308b essentially corresponds to that of the element 101 from FIG. 1A, the functionality of the lower source/drain region 308d essentially corresponds to the functionality of the element 102, the functionality of the intermediate region 308f essentially corresponds to the functionality of the element 103, and the functionality of the upper source/drain region 308e essentially corresponds to that of the element 104. Furthermore, in a similar manner to that as shown in FIG. 1A, the layer sequence 308d, 308f, 308e is covered along the exposed peripheral surface with a gate oxide layer (not shown in FIG. 3B). The gate region of the vertical transistor 308a is understood to be the surrounding region of the gate oxide layer which can be coupled to a gate electrode. In other words, the electrical conductivity of the conductive channel of the vertical transistor 308a can be controlled by applying a suitable electrical voltage to an electrically conductive gate region, which may be arranged for example annularly around the gate oxide layer.

It should be pointed out that different vertical transistors shown in FIG. 3B may be of different conduction types (i.e. p conduction type or n conduction type), so that the doping in the individual components of the transistors 301 to 306 may deviate from the conditions shown in FIG. 1A. It should be pointed out that a distinction is no longer explicitly made hereinafter between a source/drain region and a source/drain terminal since these are electrically coupled directly to one another.

In order to obtain the layer arrangement 310 shown in FIG. 3B, a first coupling means 311 made of silicon for coupling the second source/drain region 305b of the first switching transistor 305 to the first source/drain regions 301a, 303a of the first and third flip-flop transistors 301, 303 and a second coupling means 312 made of silicon for coupling the second source/drain region 306b of the second switching transistor 306 to the first source/drain regions 302a, 304a of the second and of the fourth flip-flop transistor 302, 304 are formed in a first plane above the rectangular base area 307.

The coupling means which are formed in accordance with the exemplary embodiment described are to be understood to be structures of sufficiently good electrical conduction comprising semiconducting and/or metallic components which are used to realize an electrical coupling between the structures coupled to the coupling means.

The layer arrangement 310 is formed on a silicon substrate that is not shown in FIG. 3B. A silicon dioxide layer which forms the rectangular base area 307 is formed on said silicon substrate. In other words, the layer which forms the rectangular base area 307 is made of silicon dioxide material. A further silicon layer is applied on said silicon dioxide layer and is patterned in such a way that parts of the transistors 301 to 306 and the coupling means 311, 312 are thereby formed. This can be done using a suitable lithography and a suitable etching method. In other words, a so-called SOI substrate ("semiconductor on insulator") can be used in order to form therefrom the lower region of the layer arrangement 310 shown in FIG. 3B. The silicon coupling means 311, 312 are used to achieve the intended coupling between individual components of the respective transistors 301 to 306, and the rectangular base area 307 made of silicon dioxide material is used to decouple from one another these source/drain regions of the transistors 301 to 306 in the case of which such decoupling is desirable for the operation as an SRAM memory cell.

As an alternative, the MOSFETs 301 to 306 can also be fabricated on a bulk substrate using the STI method ("shallow trench isolation"). In this method, trenches are introduced into the surface of a silicon substrate, said trenches are filled with silicon dioxide material, and silicon structures can be formed thereon.

Figure 3C:
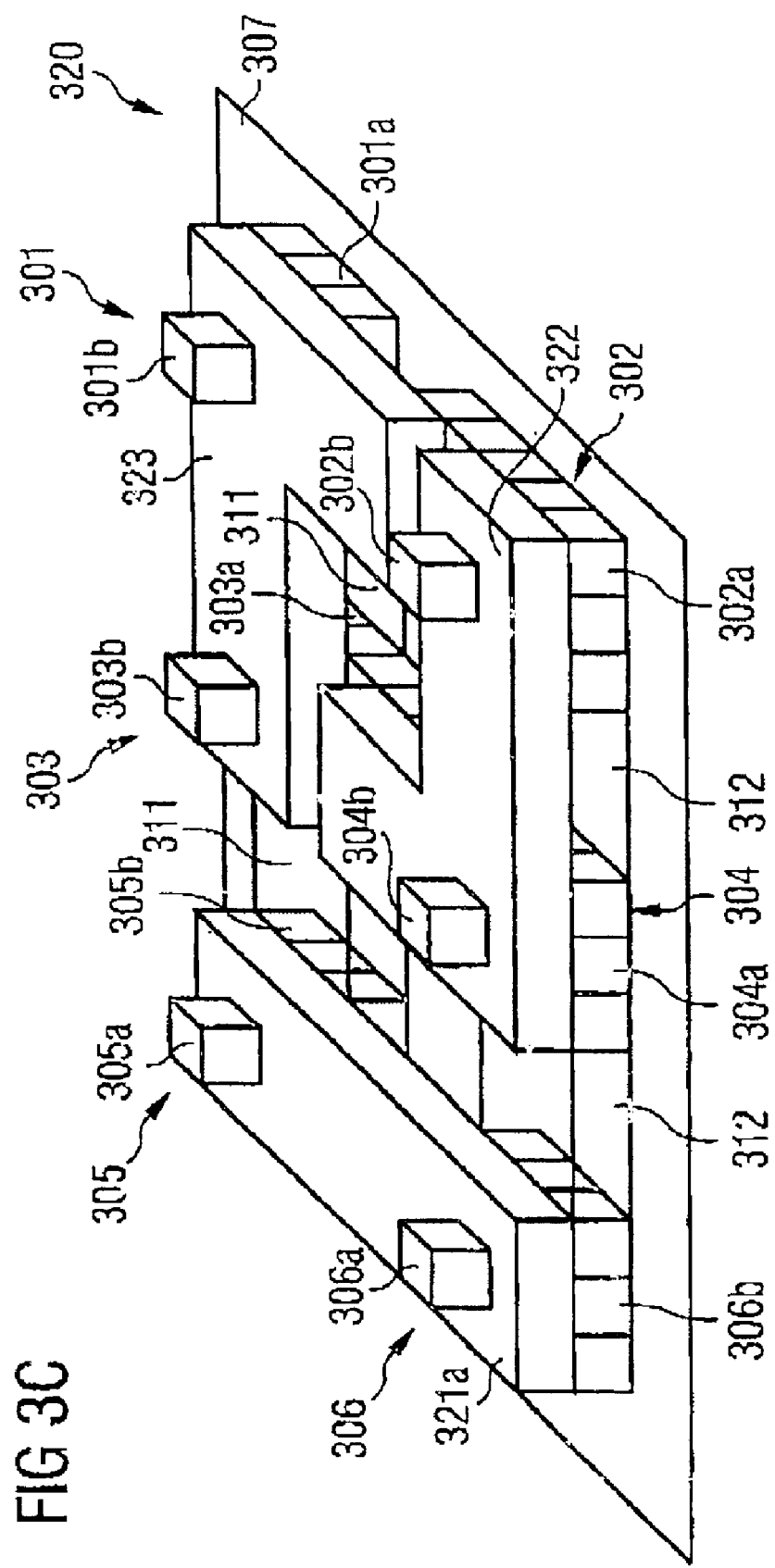
FIG. 3C shows a perspective view of a layer arrangement at a second point in time during the method for fabricating a memory cell arrangement in accordance with the first exemplary embodiment of the invention.

FIG. 3C shows a layer arrangement 320 at a second point in time during the method according to the invention for fabricating a memory cell arrangement. For the purposes of a simplified illustration, the further vertical transistors 308 of those SRAM cells which are not associated with the SRAM cell considered are not shown.

In order to attain the layer arrangement 320 shown in FIG. 3C, a first part 321a of a third coupling means 321 (see equivalent circuit diagram from FIG. 4) for electrically coupling the gate regions of the switching transistors 305, 306 to a word line (see description below), a fourth coupling means 322 for coupling the second source/drain region 305b of the first switching transistor 305 to the gate regions of the second and fourth flip-flop transistors 302, 304 and a fifth coupling means 323 for coupling the second source/drain region 306b of the second switching transistor 306 to the gate regions of the first and third flip-flop transistors 301, 303 are formed in a second plane above the first plane.

Clearly, the third to fifth coupling means 321 to 323 function as gate electrodes of the vertical transistors 301 to 306 respectively assigned to them. The first part 321a of the third coupling means 321 is coupled to a word line in a later method step, whereas the second and third coupling means 322, 323 clearly function as crossover connections of the flip-flop of the SRAM cell.

Figure 3D:
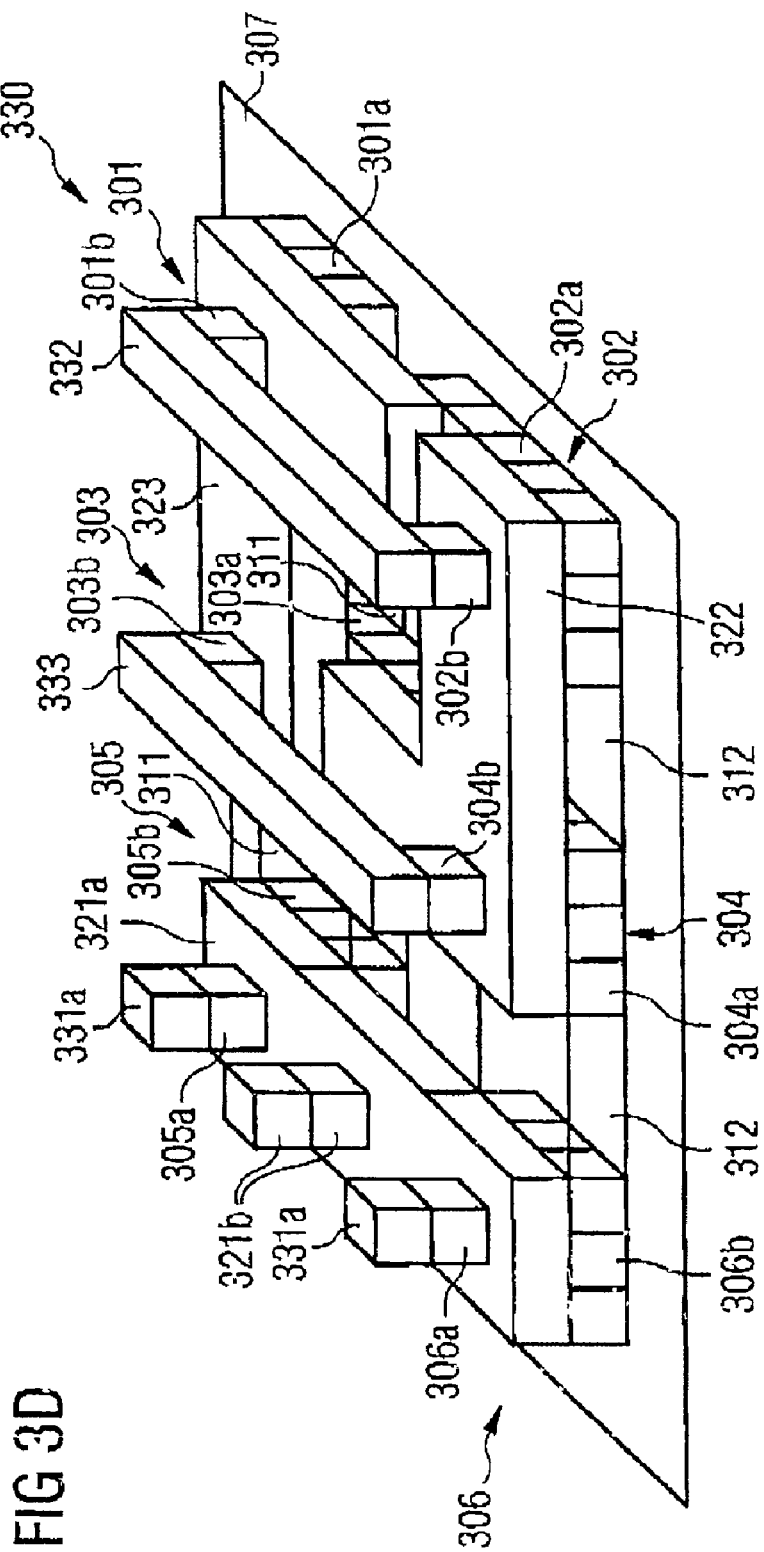
FIG. 3D shows a perspective view of a layer arrangement at a third point in time during the method for fabricating a memory cell arrangement in accordance with the first exemplary embodiment of the invention.

A layer arrangement 330 at a third point in time during the fabrication method according to the invention is described below with reference to FIG. 3D.

In order to obtain the layer arrangement 330 shown in FIG. 3D, a second part 321b of the third coupling means 321 for electrically coupling the gate regions of the switching transistors 305, 306 to a word line, a first part 331a of a sixth coupling means 331 for electrically coupling the first source/drain regions 305a, 306a of the switching transistors 305, 306 to bit lines (see below), a seventh coupling means 332 for coupling the second source/drain regions 301b, 302b of the first and second flip-flop transistors 301, 302 to the electrical potential of a supply voltage source, and an eighth coupling means 333 for coupling the second source/drain regions 303b, 304b of the third and fourth flip-flop transistors 303, 304 to an electrical ground potential are formed in a third plane above the second plane.

The sixth, the seventh and the eighth coupling means are fabricated from a metallic material. Via the seventh and eighth coupling means 332, 333, predetermined electrical potentials, namely the electrical potential of a supply voltage source and the electrical ground potential, respectively, are applied to the respective upper source/drain regions of the flip-flop transistors 301 to 304. The first part 331a of the sixth coupling means 331 serves for coupling the respective upper source/drain regions 305a, 306a of the switching transistors 305, 306 to a word line which is formed in a later method step (see below).

Figure 3E:
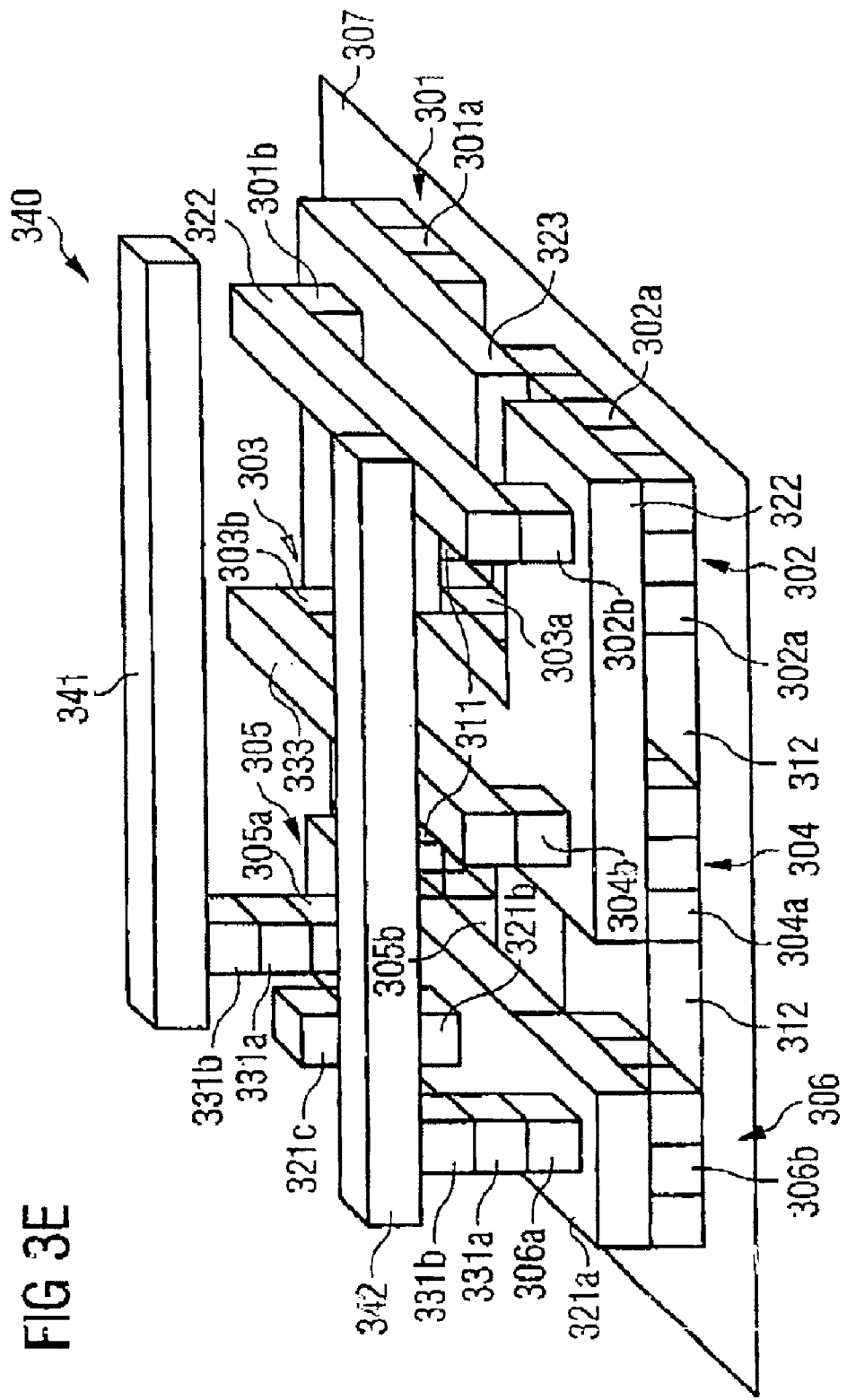
FIG. 3E shows a perspective view of a layer arrangement at a fourth point in time during the method for fabricating a memory cell arrangement in accordance with the first exemplary embodiment of the invention.

FIG. 3E shows a layer arrangement 340 as is obtained at a fourth point in time during the fabrication method according to the invention.

In order to obtain the layer arrangement 340 shown in FIG. 3E, a third part 321c of the third coupling means 321 for electrically coupling the gate regions of the switching transistors 305, 306 to a word line, a second part 331b of the sixth coupling means 331 for electrically coupling the first source/drain regions 305a, 306a of the switching transistors 305, 306 to bit lines, and a first bit line 341, coupled to the first source/drain region 305a of the first switching transistor 305, and a second bit line 342, coupled to the first source/drain region 306a of the second switching transistor 306, are formed in a fourth plane above the third plane.

In other words, there are formed in this method step coupling elements for the subsequent production of a coupling between the respective components of the transistors 301 to 306 and two bit lines and a word line, and also a first bit line 341 and a second bit line 342, which are coupled to the switching transistors 305, 306 in the manner described.

FIG. 3F shows a memory cell arrangement 350 in accordance with a first preferred exemplary embodiment of the invention.

The memory cell arrangement 350 is obtained by a process in which, proceeding from the layer arrangement 340, a fourth part 321d of the third coupling means 321 for electrically coupling the gate regions of the switching transistors 305, 306 to a word line, and a word line 351, coupled to the gate regions of the first and second switching transistors 305, 306, are formed in a fifth plane above the fourth plane.

It should be noted that a plurality of electrically insulating regions are omitted in FIG. 3F for reasons of clarity in the illustration. Such electrically insulating regions serve to form intermediate regions between those electrically conductive components which are to be electrically decoupled from one another in accordance with the functionality of the memory cell arrangement 350. Furthermore, such electrically insulating regions serve for reliably embedding the functionally important components of the memory cell arrangement 350 and thus protecting them against damage and mechanically stabilizing them.

To summarize, the memory cell arrangement 350 has a plurality of SRAM memory cells, only one of which is shown in FIG. 3F. The SRAM memory cell shown in FIG. 3F has the six vertical transistors 301 to 306, of which four are connected up as flip-flop transistors 301 to 304 and two are connected up as switching transistors 305, 306, the first and the second flip-flop transistors 301, 302 and the first and second switching transistors 305, 306 being arranged in corner regions of the rectangular base area 307. In accordance with the exemplary embodiment shown in FIG. 3F, the base area 307 is square. The vertical transistors 301 to 306 are field-effect transistors, more precisely MOSFETs.

When using the SRAM memory cell contained in the memory cell arrangement 350, it is essential that the first and the second flip-flop transistor 301, 302 are p-MOS transistors, whereas the two switching transistors 305, 306 and also the third and the fourth flip-flop transistor 303, 304 are n-MOS transistors. It should be pointed out that the invention is not restricted to this configuration of the conduction types of the transistors.

As indicated by the designation "$V_{dd}$" in FIG. 3F, the electrical potential of a supply voltage source is applied to the seventh coupling means 332 and therefore to the second source/drain terminals 302b, 301b of the first and second flip-flop transistors 301, 302, whereas the eighth coupling means 333 and the second source/drain regions 303b, 304b of the third and fourth flip-flop transistors 303, 304 are at the electrical ground potential. The latter is indicated by the designation "$V_{ss}$". As is furthermore shown in FIG. 3F, the first and second bit lines 341, 342 run parallel to one another and in each case orthogonally with respect to the word line 351.

FIG. 4 shows an equivalent circuit diagram 400 of the memory cell arrangement 350 shown in FIG. 3F. Identical components are provided with identical reference numerals in FIG. 3F and FIG. 4.

The first bit line 341 is coupled via the sixth coupling means 331 to the first source/drain terminal 305a of the first switching transistor 305, whose gate region is coupled to the word line 351 via the third coupling means 321. Furthermore, the second source/drain region 305b of the first switching transistor is coupled via the first coupling means 311 to the first source/drain region 301a of the first flip-flop transistor 301, to the first source/drain region 303a of the third flip-flop transistor 303, and is furthermore coupled via the fourth coupling means 322 to the gate regions of the second and fourth flip-flop transistors 302, 304. The second bit line 342 is coupled via the sixth coupling means 331 to the first source/drain region 306a of the second switching transistor 306, whose gate terminal is coupled to the word line 351 via the third coupling means 321. Furthermore, the second source/drain region 306b is coupled via the second coupling means 312 to the respective first source/drain regions 302a, 304a of the second and fourth flip-flop transistors 302, 304. Moreover, the second source/drain region 306b of the second switching transistor 306 is coupled via the second coupling means 312 and furthermore via the fifth coupling means 323 to the gate regions of the first and third flip-flop transistors 301, 303. The second source/drain terminals 301b, 302b of the first and of the second flip-flop transistor 301, 302 are coupled via the seventh coupling means 332 to a supply voltage source by means of which the electrical potential of the supply voltage $V_{dd}$ is applied to the second source/drain regions 301b, 302b of the first and second flip-flop transistors 301, 302. Furthermore, the second source/drain regions 303b, 304b of the third and fourth flip-flop transistors 303, 304 are brought to the electrical ground potential $V_{ss}$ via the eighth coupling means 333.

The description illustrates that the memory cell arrangement 350 shown in FIG. 3F can be represented by the equivalent circuit diagram 400 from FIG. 4.

The functionality of the memory cell arrangement 350 as an SRAM memory is described below.

It should be noted that a first storage node 401 and a second storage node 402 are depicted in FIG. 4. Furthermore, it should be noted that, as shown by the corresponding circuit symbols in FIG. 4, the first and second flip-flop transistors 301, 302 are formed as p-MOS transistors, whereas the third and fourth flip-flop transistors 303, 304 and also the switching transistors 305, 306 are formed as n-MOS transistors.

Clearly, an SRAM memory cell is divided into a flip-flop subcircuit, having the four flip-flop transistors 301 to 304, and into a switching subcircuit, having the switching transistors 305, 306, by means of which electrical signals are applied to the flip-flop transistors 301 to 304 and the electrical charge states of the first and second storage nodes 401, 402 are sensed. Generally, it should be noted that the information to be stored is stored in each case at the first storage node 401, and—as information with a complementary value—at the second storage node 402. The information is thus stored in redundant fashion. The word line 351 serves for activating the SRAM memory cell. If a corresponding electrical signal is applied to the word line 351, then the first and second switching transistors 305, 306 are turned on, thereby enabling an electrical coupling between the respective bit line 341 or 342 and the respective first or second storage node 401 or 402. Complementary information is stored at the first and the second storage node 401, 402, information and complementary information being impressed via the first and the second bit line 341 and 342 in the form of a respective charge state into the storage nodes 341, 342. Although in principle a single bit line suffices for coding the desired information, in accordance with the exemplary embodiment described two bit lines 341, 342 with a respectively mutually inverse signal are used in order to transfer the data reliably and at high speed.

Firstly, the way in which an item of information is written to the storage node 401 or 402 is described below. During such a write operation, firstly an electrical signal is applied to the word line 351, which electrical signal is such that the first and second switching transistors 305, 306 are turned on. An electrical signal in which the information to be stored is contained is then applied to the first bit line 341. By way of example, this electrical potential may have a logic value "1", as a result of which electrical charge is brought to the first storage node 401 from the first bit line 341 via the first and second source/drain regions 305a, 305b of the first switching transistor 305. As a result, the gate region of the fourth n-MOS flip-flop transistor 304, said gate region being coupled to said first storage node 401, is turned on, whereas the second p-MOS flip-flop transistor 302 is in the off state. The inverse electrical signal with respect to the first bit line 341, i.e. a signal with a logic value "0" in the example described, is applied to the second bit line 342, so that no electrical charge is applied to the second electrical storage node 402. As a result, the first p-MOS flip-flop transistor 301 coupled to the uncharged second storage node 402 is turned on, whereas the third n-MOS flip-flop transistor 303 coupled to the second uncharged storage node 402 is in the off state. On account of the described conduction states of the flip-flop transistors 301 to 304, the first storage node 401 is coupled to the electrical potential of the supply voltage $V_{dd}$ and is therefore at an upper reference potential, whereas the second storage node 402 is coupled to the electrical ground potential $V_{ss}$, a lower reference potential, and is therefore uncharged. Therefore, the information with the logic value "1" is stored on the first storage node 401, whereas the complementary information with respect thereto is stored on the second storage node 402.

In order to read out the information that has been stored in the manner described, an electrical voltage is again applied to the word line 351, which voltage is set up in such a way that the first and second switching transistors 305, 306 are thereby turned on. Since the first storage node 401 was occupied with electrical charge in the write operation that took place previously, an electric current flows from the first storage node 401 via the second and first source/drain regions 305b, 305a of the first switching transistor 305 right into the first bit line 341 and can be detected there in order to sense the charge state of the first storage node 401. The second bit line 342 is coupled to the second storage node 402 via the second switching transistor 306 in the on state, and since, as described above, the second electrical storage node 402 is subjected to charge reversal, no electric current flows in the second bit line 342, in which an item of information is coded which is complementary to the information contained in the current flow in the first bit line 341.

A layout view in plan view of the memory cell arrangement shown in FIG. 3F is described below with reference to FIG. 5.

FIG. 5 clearly shows an illustration of the memory cell arrangement 350 from FIG. 3F along a direction which is directed from top to bottom in accordance with FIG. 3F. However, FIG. 5 is not a true plan view since deeper planes which are covered by other components are also visible in some instances. Components which are shown both in FIG. 3F and in FIG. 5 and are identical are provided with the same reference numerals. In particular, FIG. 5 shows the spatial extent of an SRAM memory cell 500 of the memory cell arrangement 350. Furthermore, the vertical transistors 301 to 306 are depicted diagrammatically as bars in FIG. 5. In order to compensate for the different mobilities between electrons and holes, for the purposes of visual illustration, the p-type vertical transistors 301, 302 are each depicted with a double bar, whereas the n-type vertical transistors 303 to 306 are depicted diagrammatically with a single bar. For further illustration, those material regions of the memory cell arrangement 350 which correspond to the first to fifth planes defined above are identified visually in FIG. 5. Components of the first plane 501, of the second plane 502, of the third plane 503, of the fourth plane 504 and of the fifth plane 505 are identified visually in FIG. 5 in the way that can be seen from the legend of FIG. 5. It should furthermore be pointed out that the components of the second plane 502 are fabricated from polysilicon material. The components of the first plane 501 are fabricated from silicide, i.e. from metalized silicon. The components of the third plane 503, of the fourth plane 504 and of the fifth plane 505 are fabricated from a metallic material.

As shown in FIG. 5, the extent of the SRAM memory cell 500 is 6 F both in the horizontal and in the vertical direction. This includes in each case a spacing of 0.5 F at the left-hand and right-hand and at the upper and lower edge sections of the SRAM memory cell 500. An SRAM memory cell with a space requirement of 36 $F^2$ is produced in this way.

It should be pointed out that only the essential masks for fabricating the wiring plane are illustrated in FIG. 5. By contrast, masks for fabricating the various MOSFETs and for patterning, implantation, etc., are not shown in FIG. 5.

FIG. 6A shows a memory cell arrangement 600 in accordance with a second exemplary embodiment of the invention. In particular, four SRAM memory cells 601 to 604 are shown which, however, constitute a mere detail from the memory cell arrangement 600, which has a multiplicity of SRAM memory cells. Those components in the memory cell arrangement 600 for which a corresponding element is contained in the memory cell arrangement 350 from FIG. 3F or from FIG. 5 are provided with the same reference numerals. Furthermore, the legend (materials of five planes 501 to 505) from FIG. 5 also applies to the memory cell arrangement 600 shown in FIG. 6A.

In the memory cell arrangement 600, a separate first and second bit line 341, 342 is in each case provided for each row of memory cells in the matrix-type arrangement. For the purposes of clarity in the illustration, the individual components of each SRAM memory cell are only represented for the first SRAM memory cell 601.

A memory cell arrangement 610 in accordance with a third preferred exemplary embodiment of the invention is shown below with reference to FIG. 6B.

DETAILED DESCRIPTION OF THE INVENTION

Figure 6B:
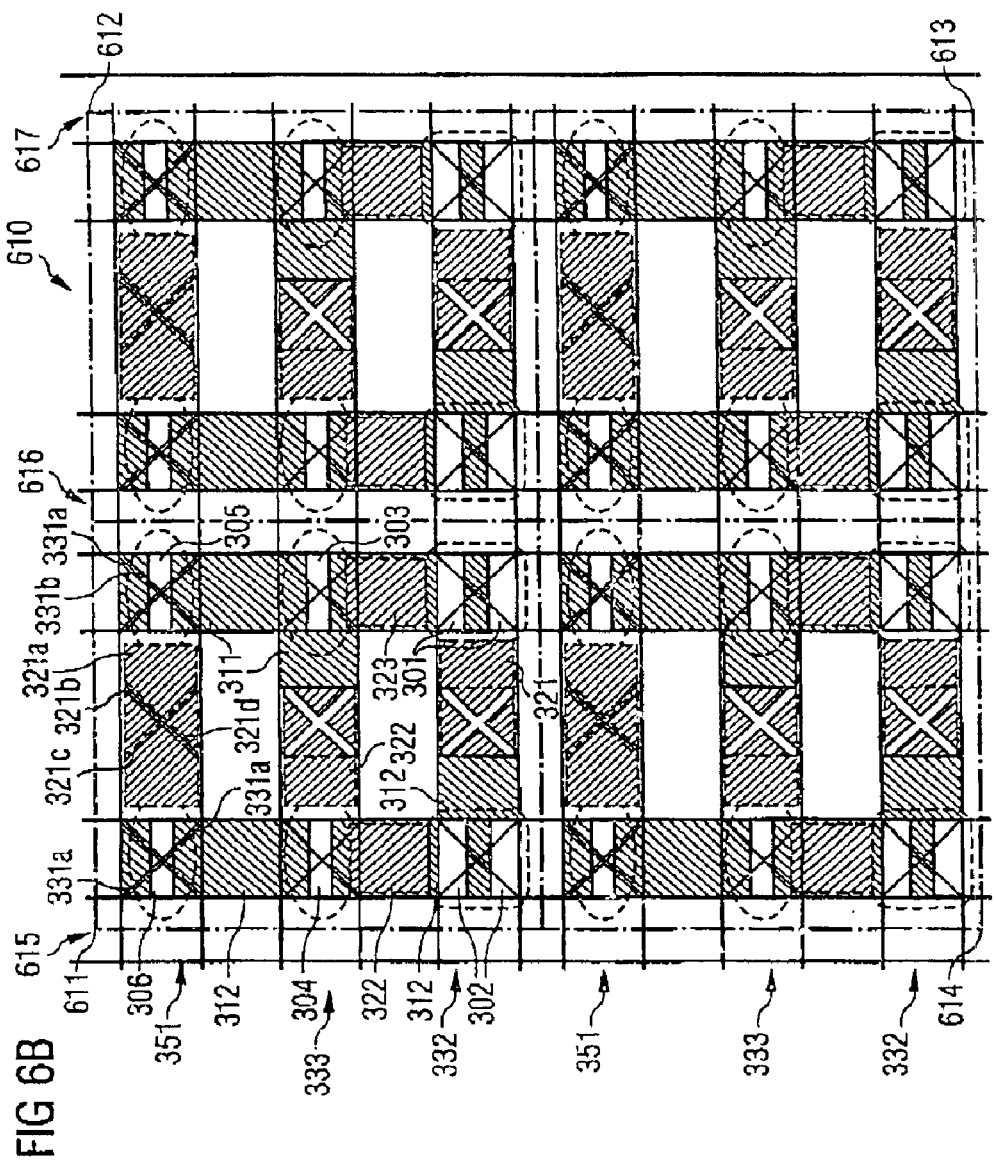
FIG. 6B shows a layout view in plan view of a memory cell arrangement in accordance with a third exemplary embodiment of the invention.

The memory cell arrangement 610 shown in FIG. 6B differs from the memory cell arrangement 600 shown in FIG. 6A essentially by the fact that, unlike in FIG. 6A, each row of SRAM memory cells does not have a dedicated, separate bit line and a dedicated, separate inverse bit line (reference numerals 341, 342 in FIG. 6A), rather that bit lines of mutually adjacent SRAM memory cells are formed jointly. In other words, a respective first bit line of a first memory cell is embodied jointly with a respective first bit line of a second memory cell, and a respective second bit line (with the inverse information) of a first memory cell is embodied jointly with a second bit line of a second memory cell. Otherwise, the architecture shown in FIG. 6B does not differ from that shown in FIG. 6A.

The memory cell arrangement 610 shown in FIG. 6B has a first SRAM memory cell 611, a second SRAM memory cell 612, a third SRAM memory cell 613 and a fourth SRAM memory cell 614, which are formed identically. The reference symbols and also the legend from FIG. 5 and FIG. 3F are again used in FIG. 6B. Only the individual components of the first SRAM memory cell 611 are provided with reference symbols, for the purposes of simplified illustration. Furthermore, FIG. 6B shows a first bit line 615, a second bit line 616 and a third bit line 617. The first bit line 615 performs the functionality of the second bit line 342 from FIG. 6A with regard to the first SRAM memory cell 611, and the second bit line 616 performs the functionality of the first bit line 341 from FIG. 6A with regard to the first SRAM memory cell 611. The special feature of the exemplary embodiment shown in FIG. 6B is that the second bit line 616 not only fulfills the functionality of the first bit line 341 of the first memory cell 601 from FIG. 6A but furthermore fulfills the functionality of the second bit line 342 of the second SRAM memory cell 602 shown in FIG. 6A. In other words, with reference to FIG. 6A, the first and second bit lines 341, 342 arranged in a boundary region between the first SRAM memory cell 601 and the second SRAM memory cell 602 are embodied in one piece in the exemplary embodiment shown in FIG. 6B. Otherwise, the functionality of the memory cell arrangement 610 corresponds to that of the memory cell arrangement 600.

The following publications are cited in this document:

[1] Risch, L. Rösner, W, Schulz, T (1999) "Transistor verkehrt" ["Topsy-turvy transistor"], Spektrum der Wissenschaft, Issue June 1999, page 94 et seq.

[2] Lage, C, Hayden, J D, Subramanian, C (1996) "Advanced SRAM Technology—The Race Between 4T and 6T Cells", IEDM 1996: 271–274

[3] Subbanna, S, Agnello, P, Crabbe, E, Schulz, R, Wu, S, Tallman, K, Saccamango, J, Greco, S, McGahay, V, Allen, A J, Chen, B, Cotler, T, Eld, E, Lasky, J, Ng, H, Ray, A, Snare, J, Sunderland, D, Sun, J, Davari, B (1996) "A High-Density 6.9 sq.µm Embedded SRAM Cell in a High-Performance 0.25 µm—Generation CMOS Logic Technology", IEDM 1996: 275–278

[4] EP 0,920,060 A2

[5] U.S. Pat. No. 5,364,810

[6] U.S. Ser. No. 2002/0,027,802

[7] U.S. Ser. No. 2002/0,006,698

What is claimed is:

1. An SRAM memory cell arranged on a rectangular base area and comprising:
   six vertical transistors, of which four are connected up as flip-flop transistors and two are connected up as switching transistors; and
   four of the vertical transistors being arranged at corners of the rectangular base area.

2. The SRAM memory cell as claimed in claim 1, in which the rectangular base area is divided into a first and into a second rectangular partial region;
   the flip-flop transistors being arranged at the corners of the first rectangular partial region; and
   the switching transistors being arranged at the two corners of the second partial region which are also corners of the rectangular base area.

3. The SRAM memory cell as claimed in claim 1, in which the rectangular base area is square.

4. The SRAM memory cell as claimed in claim 3, in which the side length of the square base area is six times the smallest possible feature size that can be achieved.

5. The SRAM memory cell as claimed in one of claims 1 to 4, in which at least some of the transistors are selected from the group consisting of field-effect transistors and bipolar transistors.

6. A memory cell arrangement having a plurality of SRAM memory cells as claimed in claim 1.

7. The memory cell arrangement as claimed in claim 6, which has an electrically conductive word line coupled to the gate regions of the switching transistors.

8. The memory cell arrangement as claimed in claim 6, which has a first and a second electrically conductive bit line, the first of which is coupled to the first source/drain region of a first switching transistor and the second of which is coupled to the first source/drain region of a second switching transistor.

9. The memory cell arrangement as claimed in one of claims 6 to 8, in which the second source/drain region of the first switching transistor is coupled to the first source/drain region of a first and of a third flip-flop transistor and also to the gate regions of a second and of a fourth flip-flop transistor.

10. The memory cell arrangement as claimed in claim 9, in which the second source/drain region of the second switching transistor is coupled to the first source/drain regions of the second and of the fourth flip-flop transistor and also to the gate regions of the first and of a third flip-flop transistor.

11. The memory cell arrangement as claimed in claim 10, which has a first reference potential, which is applied to the second source/drain regions of the first and of the second flip-flop transistor.

12. The memory cell arrangement as claimed in claim 9, which has a second reference potential, which is applied to the second source/drain regions of the third and of the fourth flip-flop transistor.

13. The memory cell arrangement as claimed in claim 12, in which the first reference potential is defined by means of a supply voltage source, and in which the second reference potential is a ground potential.

14. The memory cell arrangement as claimed in claim 9, in which the first and the second flip-flop transistor are arranged at corners of the rectangular base area.

15. The memory cell arrangement as claimed in claim 8, in which the first and the second bit line are arranged such that they run essentially perpendicular to the word line and such that they run essentially parallel to one another.

16. The memory cell arrangement as claimed in claim 6, in which the rectangular base area is an electrically insulating region.

17. The memory cell arrangement as claimed in claim 16, in which;
a first coupling means for coupling the second source/drain region of the first switching transistor to the first source/drain regions of the first and of the third flip-flop transistor; and
a second coupling means for coupling the second source/drain region of the second switching transistor to the first source/drain regions of the second and of the fourth flip-flop transistor are formed in a first plane above the rectangular base area.

18. The memory cell arrangement as claimed in claim 17, in which
a first part of a third coupling means for electrically coupling the gate regions of the switching transistors to the word line;
a fourth coupling means for coupling the second source/drain region of the first switching transistor to the gate regions of the second and fourth flip-flop transistors; and
a fifth coupling means for coupling the second source/drain region of the second switching transistor to the gate regions of the first and third flip-flop transistors are formed in a second plane above the first plane.

19. The memory cell arrangement as claimed in claim 18, in which
a second part of the third coupling means for electrically coupling the gate regions of the switching transistors to the word line;
a first part of a sixth coupling means for electrically coupling the first source/drain regions of the switching transistors to the bit lines;
a seventh coupling means for coupling the second source/drain regions of the first and of the second flip-flop transistor to the first reference potential; and
an eighth coupling means for coupling the second source/drain regions of the third and of the fourth flip-flop transistor to the second reference potential are formed in a third plane above the second plane.

20. The memory cell arrangement as claimed in claim 19, in which
a third part of the third coupling means for electrically coupling the gate regions of the switching transistors to the word line;
a second part of the sixth coupling means for electrically coupling the first source/drain regions of the switching transistors to the bit lines; and
the first bit line, coupled to the first source/drain region of the first switching transistor, and the second bit line, coupled to the first source/drain region of the second switching transistor, are formed in a fourth plane about the third plane.

21. the memory cell arrangement as claimed in claim 20, in which
a fourth part of the third coupling means for electrically coupling the gate regions of the switching transistors to the word line; and
the word line, coupled to the gate regions of the first and of the second switching transistor, are formed in a fifth plane above the fourth plane.

22. A method for fabricating a memory cell arrangement, comprising:
forming a SRAM cell on a rectangular base area by six vertical transistors, of which four are connected up as flip-flop transistors and two are connected up as switching transistors, being formed on a rectangular base area; and
arranging four of the vertical transistors at corners of the rectangular base area.

23. The method as claimed in claim 22, further comprising: dividing the rectangular base area of the SRAM memory cell into a first and into a second rectangular partial region,
forming the flip-flop transistors at the corners of the first rectangular partial region; and
forming the switching transistors at the two corners of the second partial region which are also corners of the rectangular base area.

24. The method as claimed in claim 22 or 23, further comprising:
forming a first coupling means for coupling the second source/drain region of a first switching transistor to the first source/drain regions of a first and of a third flip-flop transistor in a first plane above the rectangular base area; and
forming a second coupling means for coupling the second source/drain region of a second switching transistor to the first source/drain regions of a second and of a fourth flip-flop transistor in a first plane above the rectangular base area.

25. The method as claimed in claim 24, further comprising:
forming a first part of a third coupling means for electrically coupling the gate regions of the switching transistors to a word line in a second plane above the first plane;

forming a fourth coupling means for coupling the second source/drain region of the first switching transistor to the gate regions of the second and fourth flip-flop transistors in a second plane above the first plane; and forming a fifth coupling means for coupling the second source/drain region of the second switching transistor to the gate regions of the first and third flip-flop transistors in a second plane above the first plane.

26. The method as claimed in claim 25, further comprising:

forming a second part of the third coupling means for electrically coupling the gate regions of the switching transistors to a word line in a third plane above the second plane;

forming a first part of a sixth coupling means for electrically coupling the first source/drain regions of the switching transistors to bit lines in a third plane above the second plane;

forming a seventh coupling means for coupling the second source/drain regions of the first and of the second flip-flop transistor to a first reference potential in a third plane above the second plane; and forming an eighth coupling means for coupling the second source/drain regions of the third and of the fourth flip-flop transistor to a second reference potential in a third plane above the second plane.

27. The method as claimed in claim 26, further comprising:

forming a third part of the third coupling means for electrically coupling the gate regions of the switching transistors to a word line in a fourth plane above the third plane;

forming a second part of the sixth coupling means for electrically coupling the first source/drain regions of the switching transistors to bit lines in a fourth plane above the third plane; and forming a first bit line, coupled to the first source/drain region of the first switching transistor, and a second bit line, coupled to the first source/drain region of the second switching transistor, in a fourth plane above the third plane.

28. The method as claimed in claim 27, further comprising:

forming a fourth part of the third coupling means for electrically coupling the gate regions of the switching transistors to a word line in a fifth plane above the fourth plane; and forming a word line, coupled to the gate regions of the first and of the second switching transistor, in a fifth plane above the fourth plane.

* * * * *